(12) United States Patent
Aoki et al.

(10) Patent No.: US 11,315,997 B2
(45) Date of Patent: Apr. 26, 2022

(54) DISPLAY DEVICE USING A FLEXIBLE SUBSTRATE WITH ALIGNMENT MARKS FOR FOLDING

(71) Applicant: Japan Display Inc., Tokyo (JP)

(72) Inventors: Hayata Aoki, Tokyo (JP); Kengo Kato, Tokyo (JP); Jun Hanari, Tokyo (JP); Yasuyuki Yamada, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/826,389

(22) Filed: Mar. 23, 2020

(65) Prior Publication Data

US 2020/0219956 A1 Jul. 9, 2020

Related U.S. Application Data

(63) Continuation of application No. PCT/JP2018/029603, filed on Aug. 7, 2018.

(30) Foreign Application Priority Data

Oct. 4, 2017 (JP) .............................. JP2017-193981

(51) Int. Cl.
  *H01L 27/32* (2006.01)
  *H01L 51/56* (2006.01)
  *B32B 3/02* (2006.01)
(52) U.S. Cl.
  CPC ............ *H01L 27/3262* (2013.01); *B32B 3/02* (2013.01); *H01L 51/56* (2013.01); *H01L 2251/5338* (2013.01)

(58) Field of Classification Search
  CPC ............... H01L 51/0097; H01L 23/544; H01L 2223/54426; H01L 2224/0213; H01L 2224/0217; H01L 2224/0224
  See application file for complete search history.

(56) References Cited

U.S. PATENT DOCUMENTS 5,777,610 A * 7/1998 Sugimoto .............. H05K 1/147
  345/206
9,172,063 B2 * 10/2015 Hamada .................. H01J 9/242
  (Continued)

FOREIGN PATENT DOCUMENTS

JP  S63-142324 A  *  6/1988  ............... G02F 1/13
JP  S63-142324 A     6/1988
  (Continued)

OTHER PUBLICATIONS

English translation, Takamura, Japanese Pat. Pub. No. JP S63-142324A, translation date: Aug. 2021, Schreiber Translations, Inc., all pages. (Year: 2021).*

(Continued)

*Primary Examiner* — Victoria K. Hall
(74) *Attorney, Agent, or Firm* — Michael Best & Friedlich LLP

(57) ABSTRACT

Display device includes a flexible substrate, a plurality of pixels disposed on a first surface of flexible substrate, and a plurality of alignment marks disposed along one side of the flexible substrate and identified each other. The plurality of alignment marks may be arranged in the same layer. When the plurality of pixels includes thin film transistor, the plurality of alignment marks may be formed of the same metal layer as the metal layer forming thin film transistor.

17 Claims, 14 Drawing Sheets

(56) References Cited

U.S. PATENT DOCUMENTS

| | | | | |
|---|---|---|---|---|
| 9,490,215 | B2* | 11/2016 | Yang | B32B 37/14 |
| 10,043,835 | B2* | 8/2018 | Saeki | G02F 1/1303 |
| 10,283,535 | B2* | 5/2019 | Saeki | G02F 1/1303 |
| 10,303,014 | B2* | 5/2019 | Oh | G02F 1/13452 |
| 10,446,770 | B2* | 10/2019 | Kim | H01L 51/0097 |
| 10,529,745 | B2* | 1/2020 | Lee | G06F 3/0412 |
| 2002/0149921 | A1* | 10/2002 | Terasaka | G02F 1/13452 |
| | | | | 361/803 |
| 2003/0053056 | A1* | 3/2003 | Ohazama | G01R 31/68 |
| | | | | 356/401 |
| 2003/0059726 | A1* | 3/2003 | Hirooka | H01L 23/544 |
| | | | | 430/394 |
| 2004/0170762 | A1* | 9/2004 | Newsome | H01L 51/0005 |
| | | | | 427/256 |
| 2005/0167800 | A1* | 8/2005 | Naya | H01L 21/6835 |
| | | | | 257/678 |
| 2007/0002303 | A1* | 1/2007 | Van De Moosdijk | |
| | | | | G03F 7/70691 |
| | | | | 355/72 |
| 2007/0008533 | A1* | 1/2007 | Ghinovker | G01B 11/272 |
| | | | | 356/401 |
| 2008/0030666 | A1* | 2/2008 | Abe | G02F 1/13452 |
| | | | | 349/150 |
| 2008/0101048 | A1* | 5/2008 | Mishiro | H05K 3/361 |
| | | | | 361/784 |
| 2009/0140757 | A1* | 6/2009 | Shih | G02F 1/136 |
| | | | | 324/754.03 |
| 2009/0199401 | A1* | 8/2009 | Kerr | H05K 3/0014 |
| | | | | 29/848 |
| 2010/0002183 | A1* | 1/2010 | Fukuda | G02F 1/1303 |
| | | | | 349/158 |
| 2010/0201805 | A1* | 8/2010 | Hamada | H05K 13/0815 |
| | | | | 348/92 |
| 2010/0296721 | A1* | 11/2010 | Iwahashi | G01B 11/002 |
| | | | | 382/141 |
| 2011/0012294 | A1* | 1/2011 | Kiuchi | G03F 7/70791 |
| | | | | 264/446 |
| 2011/0122356 | A1* | 5/2011 | Saimen | H05K 1/0269 |
| | | | | 349/149 |
| 2011/0134075 | A1* | 6/2011 | Takusa | G06F 3/0443 |
| | | | | 345/174 |
| 2012/0256310 | A1* | 10/2012 | Ide | H01L 23/522 |
| | | | | 257/737 |
| 2012/0293974 | A1* | 11/2012 | Asano | H05K 1/0269 |
| | | | | 361/784 |
| 2012/0320290 | A1* | 12/2012 | Hida | G02F 1/13452 |
| | | | | 349/12 |
| 2013/0135458 | A1* | 5/2013 | Taniguchi | B41F 1/16 |
| | | | | 348/95 |
| 2013/0285038 | A1* | 10/2013 | Sonoda | H01L 51/5036 |
| | | | | 257/40 |
| 2014/0027861 | A1* | 1/2014 | Han | H01L 23/544 |
| | | | | 257/401 |
| 2014/0217382 | A1 | 8/2014 | Kwon et al. | |
| 2015/0137102 | A1* | 5/2015 | Yang | B32B 38/1833 |
| | | | | 257/40 |
| 2015/0279748 | A1* | 10/2015 | Spath | G01N 27/22 |
| | | | | 438/14 |
| 2016/0117042 | A1* | 4/2016 | Ito | G06F 3/0446 |
| | | | | 345/173 |
| 2016/0181346 | A1 | 6/2016 | Kwon et al. | |
| 2017/0357122 | A1* | 12/2017 | Oh | G02F 1/13452 |
| 2018/0019267 | A1* | 1/2018 | Saeki | H01L 21/67092 |
| 2018/0019417 | A1* | 1/2018 | Andou | H05K 1/0269 |
| 2018/0027673 | A1* | 1/2018 | Andou | H01L 51/0097 |
| | | | | 361/749 |
| 2018/0040576 | A1* | 2/2018 | Kim | H01L 27/3255 |
| 2018/0062026 | A1* | 3/2018 | Toribatake | H01L 33/0095 |
| 2018/0197885 | A1* | 7/2018 | Lee | H01L 23/544 |
| 2018/0224688 | A1* | 8/2018 | Chen | G02F 1/133305 |
| 2018/0337220 | A1* | 11/2018 | Kim | H01L 51/0013 |
| 2019/0058028 | A1* | 2/2019 | Won | H01L 51/56 |
| 2019/0067406 | A1* | 2/2019 | Lee | H01L 27/3276 |

FOREIGN PATENT DOCUMENTS

| | | | | |
|---|---|---|---|---|
| JP | 2005-49903 A | * | 2/2005 | G02B 5/20 |
| JP | 2011-145715 A | * | 7/2011 | G02F 1/1339 |
| JP | 2011-209405 A | | 10/2011 | |
| JP | 2012-042671 A | | 3/2012 | |
| WO | 2008/111214 A1 | | 9/2008 | |

OTHER PUBLICATIONS

Machine translation, Yanagawa, Japanese Pat. Pub. No. JP 2011-145715A, translation date: Sep. 30, 2021, Espacenet, all pages. (Year: 2021).*

Machine translation, Sonehara, Japanese Pat. Pub. No. JP 2005-049903A, translation date: Sep. 30, 2021, Espacenet, all pages. (Year: 2021).*

Written Opinion of International Searching Authority, PCT App. No. PCT/JP2018/029603, dated Sep. 18, 2018, all pages. (Year: 2018).*

International Search Report dated Sep. 18, 2018 for the PCT application No. PCT/JP2018/029603, with English machine translation.

Chinese Office Action dated May 6, 2021, issued in Chinese Appication No. 201880059172.2, with English machine translation.

Japanese Office Action dated May 18, 2021, issued in Japanese Application No. 2017-193981, with English machine translation.

English machine translation of Chinese Office Action dated Oct. 11, 2021, issued in Chinese Application No. 201880059172.2.

* cited by examiner

DISPLAY DEVICE USING A FLEXIBLE SUBSTRATE WITH ALIGNMENT MARKS FOR FOLDING

CROSS REFERENCE TO RELATED APPLICATIONS

This application is based on and claims the benefit of priority from the prior Japanese Patent Application No. 2017-193981, filed on Oct. 4, 2017, and PCT Application No. PCT/JP2018/029603 filed on Aug. 7, 2018, the entire contents of which are incorporated herein by reference.

FIELD

This invention relates to a display device using a foldable flexible substrate.

BACKGROUND

Conventionally, a display device using a flexible substrate (hereinafter referred to as "flexible substrate") as a display device for an LCD (Liquid Crystal Display) or OLED (Organic Light Emitting Diode) display has been known. The display device using a flexible substrate has a feature that it is highly versatile because the entire panels are flexible and foldable.

The use of the flexible substrate is advantageous in that a bezel part (edge part) of the display device can be reduced. For example, Japanese Patent Application Laid-Open No. 2011-209405 discloses a display device in which a flexible substrate is folded in a wiring part for connecting a pixel array part and a peripheral circuit portion, thereby arranging the peripheral circuit part on the rear surface of pixel array portion. This makes it possible to narrow the bezel part of display device and to miniaturize the display device.

SUMMARY

In one embodiment, the display device includes a flexible substrate, a plurality of pixels disposed on a first surface of the flexible substrate, and a plurality of alignment marks disposed along one side of the substrate and identified each other.

The display device according to an embodiment of the present disclosure includes a flexible substrate, a plurality of pixels arranged on a first surface of the flexible substrate, a plurality of first alignment marks arranged along one side of the flexible substrate, a resin film connected on the first surface, and a plurality of second alignment marks arranged along one side of the resin film, wherein the plurality of first alignment marks and the plurality of second alignment marks are arranged on the same straight line and identified each other.

The display device according to an embodiment of the present invention includes a flexible substrate, a plurality of pixels disposed on the first surface of the flexible substrate, a first alignment mark disposed on the first surface, a spacer disposed adjacent to a second surface of the flexible substrate opposite to the first surface, and a plurality of second alignment marks disposed along one side of the spacer and identified each other, wherein the flexible substrate has a curved part such that the second surface has a part facing each other via the spacer, the first alignment mark is disposed in a region opposite to a region in which the plurality of pixels is disposed with respect to the curved part, and any one of the plurality of second alignment marks faces the first alignment mark in a planar view.

DESCRIPTION OF EMBODIMENTS

Figure 1:
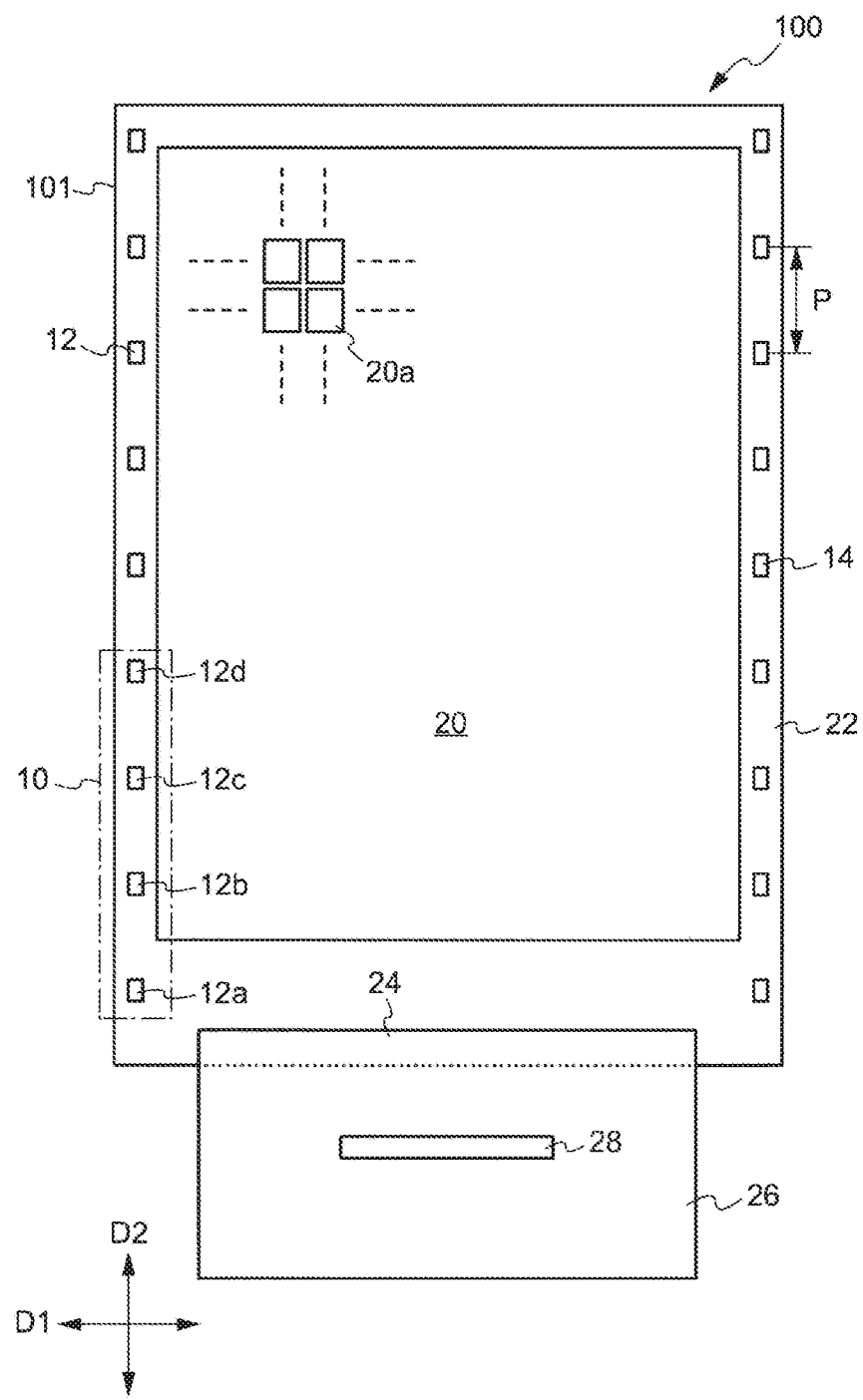
FIG. 1 is a planar diagram showing a structure of an organic EL display device according to first embodiment.

The above-mentioned document 1 discloses a configuration in which a substrate is folded by approximately 180 degrees with wiring part as a boundary. If the substrate is not folded at the correct position, wiring constituting the wiring part may be disconnected. In addition, since the wiring part is an region having a certain length, there is a possibility that the external dimensions of the display device as a product may vary depending on where the wiring part is folded.

It is an object of the present invention to improve the folding accuracy of the display device using the flexible substrate.

The embodiments of the present invention are explained below while referring to the diagrams. However, it is possible to perform the present invention using various different forms, and the present invention should not be limited to the content described in the embodiments exemplified herein.

In addition, although the width, thickness and shape of each component are shown schematically compared to their actual form in order to better clarify explanation, the drawings are merely an example and should not limit an interpretation of the present invention. In addition, in the specification and each drawing, the same reference symbols are attached to similar elements and elements that have been mentioned in previous drawings, and therefore a detailed explanation may be omitted where appropriate.

In addition, in the present specification and scope of the patent claims, [upper] and [lower] in a cross-sectional view of a display device refer to the relative positional relationship with respect to a first surface of the substrate (on the side of the substrate on which an electrooptic element is formed) or a second surface (on the side of the substrate opposite to the first surface). For example, in the present specification, for the convenience of explanation, the direction from the surface of a substrate toward an electrooptic element is referred to as [up], and the opposite direction is referred to as [below]. In addition, [upper] and [lower] in a planar view of a pixel region indicates [upper] and [lower] in the case when a diagram is viewed from the front.] In the present specification and the scope of the patent claims, when expressing a mode in which another structure is arranged above a certain structure, in the case where it is simply described as [above], unless otherwise noted, a case where another structure is arranged directly above a certain structure as if in contact with that structure, and a case where another structure is arranged via another structure above a certain structure, are both included.

In this specification and claims, a plurality of elements formed by a processing such as etching on a certain film are described as elements having different functions or roles. These elements have the same layer structure and the same material and are described as elements in the same layer.

[Display device] refers to a structure that displays an image using an electro-optical layer. For example, the term display device may refer to a display cell including an electro-optical layer or a display cell in which another optical member (eg, a polarizing member, a backlight, a touch panel, or the like) is attached. Here, the [electro-optical layer] may include a liquid crystal layer, an electroluminescence (EL) layer, an electrochromic (EC) layer, and an electrophoresis layer, unless technical contradiction occurs. Therefore, in the embodiments described below, an organic EL display device including an organic EL layer will be described as an example of a display device. However, any application to a display device including another electro-optical layer described above is not excluded.

First Embodiment

<Configuration of the Display Device>

In this embodiment, an organic EL display device is exemplified as a display device. The organic EL display device is the display device using an organic EL element as an electro-optical element.

FIG. 1 is a planar view showing a configuration of an organic EL display device 100 according to the first embodiment. A display region 20 and a periphery region 22 are formed on a support substrate 101. In the display region 20, a plurality of pixels 20a including the organic EL element is arranged. Specifically, a pixel 20a is arranged in the direction D1 (row direction) and the direction D2 (column direction) shown in FIG. 1 and arranged in a matrix as a whole. Although not shown, a circuit (e.g., a shift register circuit) for transmitting signals to the pixel 20a is disposed in the periphery region 22. However, in the present embodiment, there is no particular limitation as to what kind of circuits are arranged in the periphery region 22. The display region 20 may be provided with a dummy pixel (not shown) that does not contribute to displaying an image, as well as a pixel that actually contributes to displaying an image. In this case, a region in which a pixel contributing to displaying an image is provided may be referred to as a display region.

A terminal region 24 is formed on a support substrate 101 as a part of the periphery region 22. A plurality of wirings (not shown) is integrated in the terminal region 24, and a flexible printed circuit substrate 26 is electrically connected to the wirings. A signal (e.g., a video signal) transmitted from an external device (not shown) via the flexible printed circuit substrate 26 is transmitted to the pixel 20a via the plurality of wirings extending from the terminal region 24.

In the present embodiment, a drive circuit 28 composed of IC chips or the like is mounted on the flexible printed circuit substrate 26. The drive circuit 28 has a function of sending a control signal such as a start pulse to the shift register circuit or the like disposed in the periphery region 22, and a function of performing a predetermined signal process on the video signal. However, the drive circuit 28 is not an indispensable configuration, and may be omitted.

In the present embodiment, since a flexible substrate such as a polyimide substrate is used as the support substrate 101, the organic EL display device 100 can be folded as a whole. In this case, in order to accurately control a folding position, in the present embodiment, the alignment mark for determining the folding position is used. Specifically, in the present embodiment, a plurality of alignment marks 12 and a plurality of alignment marks 14 are arranged on the periphery region 22, and the folding position is determined using these marks. Details of the plurality of alignment marks 12 and the plurality of alignment marks 14 will be described below.

<Configure the Alignment Mark>

In FIG. 1, the plurality of alignment marks 12 is arranged along one side on the left side of the support substrate 101. Similarly, the plurality of alignment marks 14 is arranged along one side on the right side toward the support substrate 101. That is, the plurality of alignment marks 12 and the plurality of alignment marks 14 are both arranged along one side of support substrate (not shown). In the present embodiment, the individual alignment marks 12 and the plurality of alignment marks 14 are arranged at equal intervals (P), but the present invention is not limited thereto.

In the present embodiment, although the plurality of alignment marks 12 and the plurality of alignment marks 14 are arranged on the periphery region 22 at the left and right ends of the support substrate 101, if either one of the plurality of alignment marks 12 and the plurality of alignment marks 14 is arranged, alignment at the time of folding can be performed. However, by arranging the plurality of alignment marks 12 and the plurality of alignment marks 14 on the periphery region 22 at the left and right ends of the support substrate 101, alignment with higher accuracy can be achieved.

Figure 2:
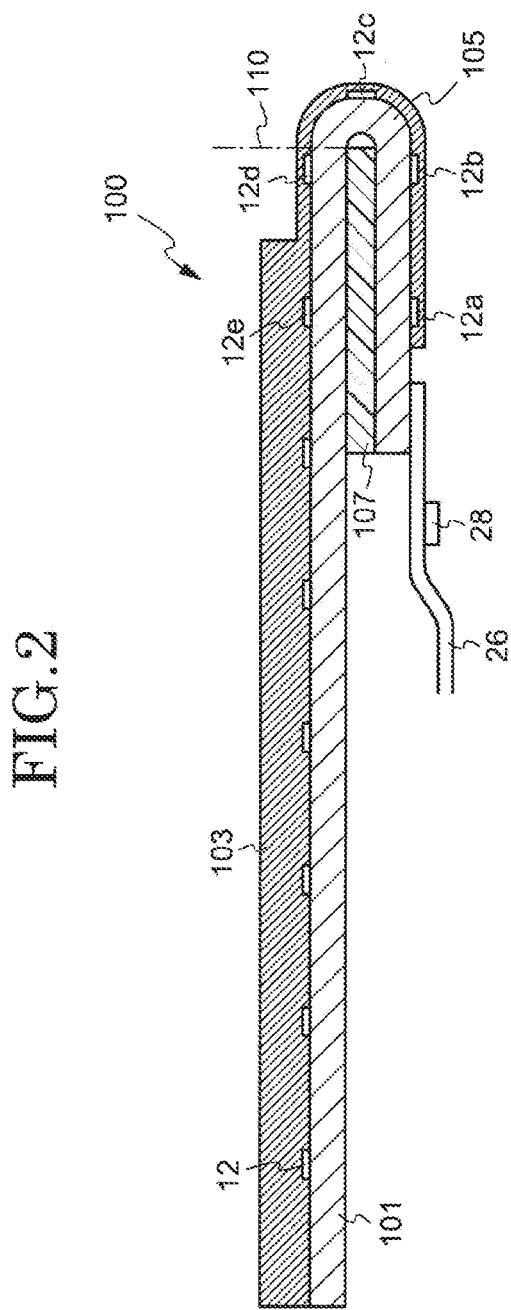
FIG. 2 is a cross-sectional diagram showing a structure of an organic EL display device according to first embodiment.

Here, how to adjust the folding position of the support substrate 101 using the plurality of alignment marks 12 and the plurality of alignment marks 14 will be described. FIG. 2 is a diagram for explaining how to adjust the folding position using the alignment mark 12 of the first embodiment. Although FIG. 2 shows an example in which the plurality of alignment marks 12 is used, alignment using the plurality of alignment marks 14 can be performed in the same manner.

In FIG. 2, the plurality of alignment marks 12 is arranged on the support substrate 101 made of a resin material. Here, the upper surface of the surface of the support substrate 101 (that is, the surface on which the pixel 20a is formed) is referred to as a first surface (or front surface), and the surface on the other side of the first surface is referred to as a second surface (or rear surface). In FIGS. 1 and 2, the plurality of alignment marks 12 and the plurality of alignment marks 14 are arranged on the first surface of the support substrate 101.

The plurality of alignment marks 12 is covered with an insulating layer 103 formed on the first surface of the support substrate 101. The insulating layer 103 is a multi-layer film formed of inorganic insulating film, organic insulating film or combinations of these insulating films. As shown in FIG. 2, in the vicinity of a curved part 105 of the support substrate 101, the thickness of the insulating layer 103 is thinner than that of other regions of the insulating layer 103. This is to make the support substrate 101 easy to bend and avoid generation of excessive stresses.

In the organic EL display device 100 shown in FIG. 2, the support substrate 101 is folded so that an alignment mark 12a and an alignment mark 12e face each other in planar view. Specifically, the support substrate 101 is folded in the vicinity of a folding position 110, and the alignment is adjusted using the alignment mark 12a and 12e. When the alignment using the alignment mark 12a and 12e is completed, the final folding position 110 is determined.

At this time, the folding position 110 changes depending on which combinations of alignment marks are used for the alignment. For example, when the alignment mark 12a and an alignment mark 12d are used to perform the alignment, the folding position 110 changes to a position closer to the alignment mark 12a. Accordingly, the folding position 110 can be adjusted to a desired position by changing the combinations of the alignment marks. The folding position 110 may be located inside or outside the display region 20.

As described above, in the present embodiment, the folding position 110 of the support substrate 101 is adjusted using the plurality of alignment marks 12 and the plurality of alignment marks 14. In order to be able to recognize the combinations of the alignment marks described above, in the present embodiment, the individual alignment mark (for example, the alignment mark 12a to 12e shown in FIG. 2) constituting the plurality of alignment marks 12 is configured to be able to identify each other (i.e., to be able to distinguish from each other). That is, at the time of alignment, it is possible to confirm what combination is currently used for alignment. Similarly, the plurality of alignment marks 14 is configured so that the individual alignment mark can identify each other.

Figure 3:
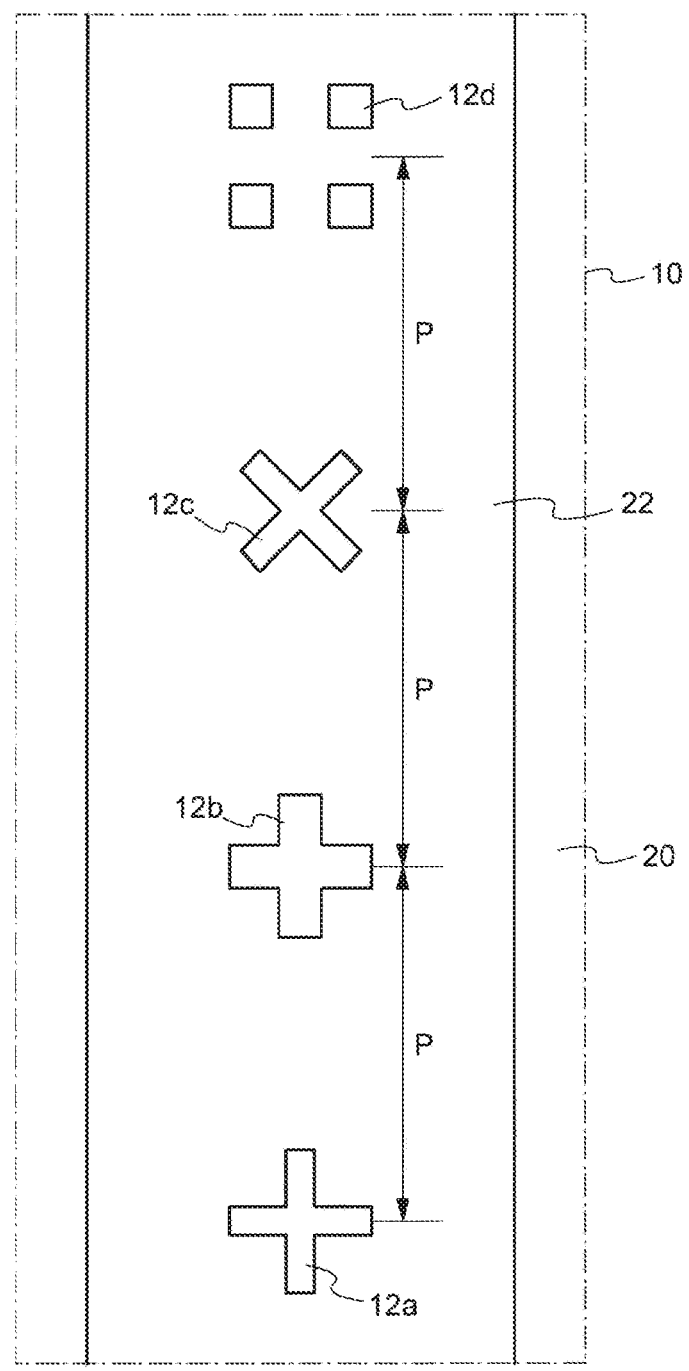
FIG. 3 is a cross-sectional diagram showing an example of a structure of an alignment mark of the organic EL display device according to first embodiment.

FIG. 3 is a diagram showing an example of the configuration of the alignment mark 12 according to the first embodiment. FIG. 3 corresponds to an enlarged view of the region surrounded by a frame line 10 of FIG. 1. As shown in FIG. 3, the alignment mark 12a to 12d of the present embodiment have different shapes and can identify each other. However, the shape shown in FIG. 3 is merely an example, and the present invention is not limited thereto.

Figure 4A:
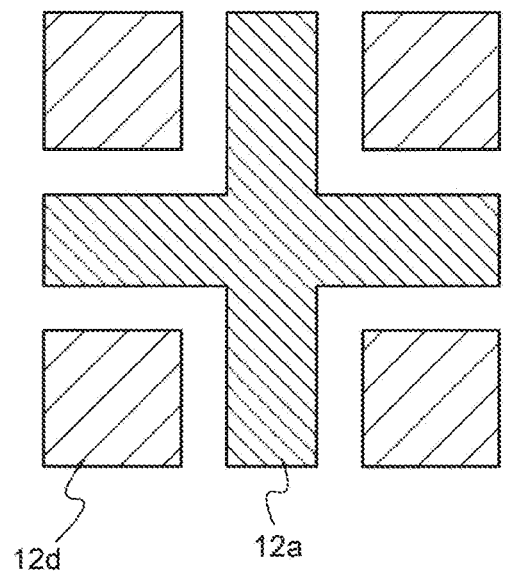
FIG. 4A is a diagram illustrating a state of alignment using an alignment mark according to the first embodiment.
Figure 4B:
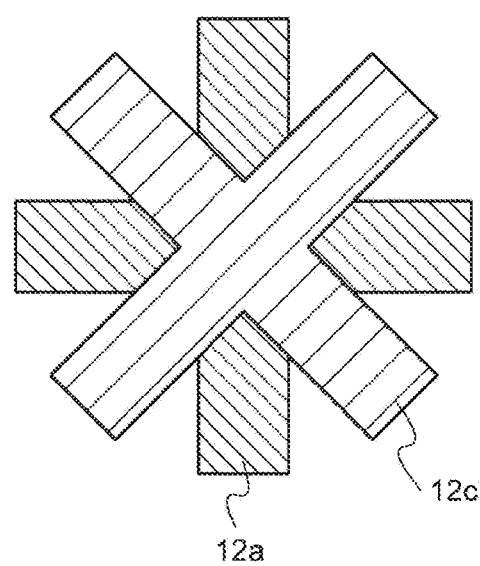
FIG. 4B is a diagram illustrating a state of alignment using an alignment mark according to the first embodiment.

As shown in FIG. 3, the individual alignment mark 12a to 12d preferably have a shape that is paired with each other to facilitate alignment. For example, when alignment is performed using the alignment mark 12a and the alignment mark 12d, it is determined that the support substrate 101 is folded at the target position when the condition shown in FIG. 4A is obtained. Further, when the alignment mark 12a and the alignment mark 12c are used to perform the alignment, it is determined that the support substrate 101 is folded at the target position when the condition shown in FIG. 4B is obtained.

The plurality of alignment marks 14 have the same configuration as the plurality of alignment marks 12 shown in FIG. 3. For example, in FIG. 1, the alignment mark 12 and the alignment mark 14 arranged in the direction D1 may have the same shape.

As shown in FIG. 2, a spacer 107 is disposed in the folded portion, i.e., the curved part 105. Specifically, the spacer 107 is arranged close to the second surface (back surface) of the support substrate 101. The spacer 107 serve to prevent the curvature of the curved part 105 from becoming unnecessarily large. When the support substrate 101 is folded, the support substrate 101 has a part facing each other through the spacer 107. Therefore, the spacer 107 also has a function of maintaining a gap so that the second surfaces of the support substrate 101 do not touch each other.

The plurality of alignment marks 12 and the plurality of alignment marks 14 may be formed by any process in the process of manufacturing the organic EL display device 100. In the present embodiment, in the process of forming the pixel 20a of the organic EL display device 100, the plurality of alignment marks 12 and the plurality of alignment marks 14 are formed without increasing the number of steps.

<Pixel Configuration>

The configuration of the pixel 20a and the plurality of alignment marks 12 of the organic EL display device 100 according to the present embodiment will be described. The pixel 20a shown in FIG. 1 is actually composed of three sub-pixels corresponding to three colors of R, G, and B. However, for convenience of explanation, one sub-pixel will be described.

Figure 5:
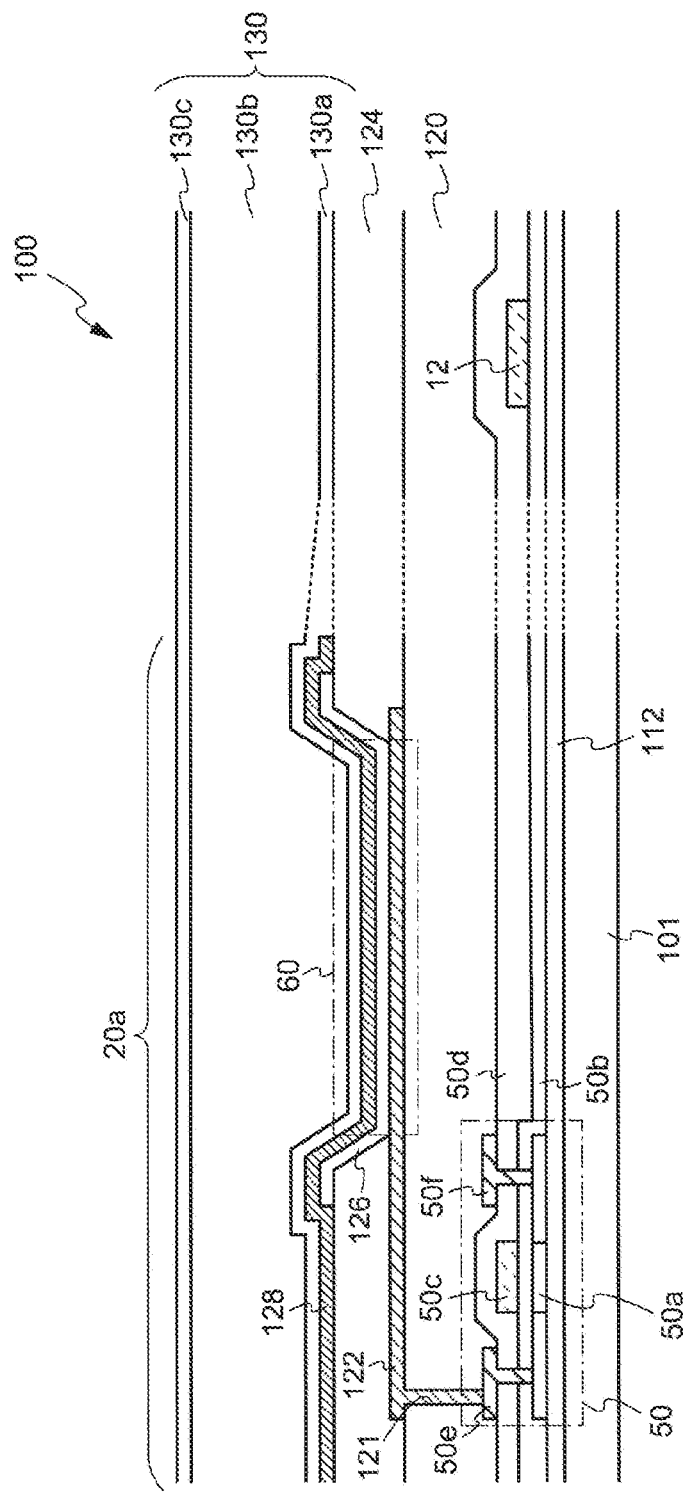
FIG. 5 is a cross-sectional diagram showing a structure of an organic EL display device according to first embodiment.

FIG. 5 is a cross-sectional view showing the configuration of the organic EL display device 100 according to the first embodiment. In FIG. 5, a thin film transistor 50 is provided on the support substrate 101 via a base film 112. In the present embodiment, a substrate made of a flexible resin material is used as the support substrate 101. Specifically, in the present embodiment, the polyimide substrate is used. However, the present invention is not limited to this, and other resin substrate may be substituted in view of heat resistance to a later process. As the base film 112, an inorganic insulating film such as a silicon oxide film is used.

The thin film transistor 50 is a so-called top-gate type thin film transistor. However, the present invention is not limited to this, and other type of thin film transistor, such as bottom-gate type thin film transistor, may be used. The thin film transistor 50 shown in FIG. 5 includes a semiconductor layer 50a, a gate insulating film 50b, a gate electrode 50c, an insulating film 50d, a source electrode 50e, and a drain electrode 50f, and functions as a drive transistor for supplying a current to an organic EL element 60. In the present embodiment, N channel type transistor is used as the thin film transistor 50, but P channel type transistor can also be used. If required, storage capacitor may be formed in the process of forming the thin film transistor 50.

In this embodiment, when the gate electrode 50c of the thin film transistor 50 is formed, the plurality of alignment marks 12 is simultaneously formed in the periphery region 22. For example, when the gate electrode 50c is formed by patterning after the metallic layers of tantalum, tungsten, or the like are formed, the plurality of alignment marks 12 is formed using the same photomask. As a result, the plurality of alignment marks 12 can be formed on the first surface of the support substrate 101 without newly increasing the number of steps. Although only the plurality of alignment marks 12 is shown here, the plurality of alignment marks 14 is also formed on the support substrate 101 at the same time. Although only one alignment mark 12 is shown in FIG. 5 for convenience of description, the plurality of alignment marks 12 is actually formed.

As described above, in the present embodiment, the plurality of alignment marks 12 and the plurality of alignment marks 14 are formed using the gate electrode 50c constituting the thin film transistor 50. Therefore, the gate electrode 50c, the plurality of alignment marks 12, and the plurality of alignment marks 14 are formed in the same layer. In the present embodiment, an example in which a metal layer of the same layer as the gate electrode 50c is used as the plurality of alignment marks 12 and the plurality of alignment marks 14 are shown, but for example, the plurality of alignment marks 12 and the plurality of alignment marks 14 may be formed using the metal layer of the same layer as the source electrode 50e and the drain electrode 50f. That is, the plurality of alignment marks 12 and the plurality of alignment marks 14 of the present embodiment can be formed of the metal layer of the same layer as the metal layer forming the thin film transistor 50.

The thin film transistor 50 is covered with an organic insulating film 120. The organic insulating film 120 functions as a planarizing film for flattening undulations caused by shapes of the thin film transistor 50. In the present embodiment, an insulating film including a resin material such as an acrylic resin or a polyimide resin is used as the organic insulating film 120, but an insulating film including other resin material may be used.

A pixel electrode 122 which functions as an anode electrode of an organic EL device 60 is provided on the organic insulating film 120. The pixel electrode 122 is connected to the source electrode 50e of the thin film transistor 50 via an opening part 121 provided in the organic insulating film 120.

In the present embodiment, as the pixel electrode 122, a conductive film having a stacked structure in which a silver-containing thin film is sandwiched by the conductive film made of a metallic oxide is used. Specifically, the pixel electrode 122 is formed of a stacked film in which an IZO (Indium Zinc Oxide) thin film, a silver thin film, and an IZO thin film are stacked in this order. However, an ITO (Indium Tin Oxide) thin film may be used instead of the IZO thin film. In order to configure the light emitted from the organic EL device 60 to exit upwardly, the pixel electrode 122 preferably includes a reflective conductive film. Therefore, in the present embodiment, a thin film made of a metallic material containing silver or silver alloys having a high reflectivity is used as a part of the pixel electrode 122.

The pixel electrode 122 is partially covered with a bank 124 made of organic materials. Specifically, the bank 124 covers the ends of the pixel electrode 122 and exposes a part of the upper surface of the pixel electrode 122. The part of the exposed upper surface of the pixel electrode 122 becomes a substantial light emitting region of the pixel 20a. That is, the bank 124 serves to define the light emitting region of the pixel 20a. As the organic material constituting the bank 124, a resin material such as an acrylic resin or a polyimide resin can be used, but the present invention is not limited thereto.

An organic EL layer 126 is disposed in a region of the upper surface of the pixel electrode 122 where the bank 124 do not overlap. In the present embodiment, the organic EL layer 126 is formed by depositing an organic EL material by an evaporation method. The organic EL layer 126 includes at least a light emitting layer (not shown) and may also include an electron injection layer, an electron transport layer, an electron blocking layer, a hole injection layer, a hole transport layer and/or a hole blocking layer. As the organic EL layer 126, for example, organic EL materials that emit red light, blue light, or green light can be used.

In the present embodiment, a structure in which a light-emitting layer having different emission colors are provided for each pixel is exemplified, but the present invention is not limited thereto. For example, although not shown, a white light emitting organic EL layer may be provided over a plurality of pixels. In this case, white light is separated into R, G, and B colors by color filters provided in each pixel. The functional layers such as the electron injection layer, the electron transport layer, the electron blocking layer, the hole injection layer, the hole transport layer, and the hole blocking layer may be provided over the plurality of pixels.

A common electrode 128 comprised of a conductive film containing an alkali metal or an alkaline earth metal is provided above the organic EL layer 126. As the alkali metal or the alkaline earth metal, for example, magnesium (Mg), lithium (Li), or the like can be used. In the present embodiment, a MgAg film which is an alloy of magnesium and silver is used as the conductive film containing the alkali metal or the alkaline earth metal. The common electrode 128 functions as a cathode of the organic EL device 60. The common electrode 128 is provided over the plurality of pixels.

When a top emission type display device in which light emitted from the organic EL layer 126 is extracted to the upper surface side, that is, to the common electrode 128 side, is used, the common electrode 128 is required to be transparent to light. When the conductive film containing the above-mentioned alkali metal or alkaline earth metal is used as the common electrode 128, the thickness of the common electrode 128 is made thin enough to transmit the emitted light in order to impart transparency to the light. Specifically, when the thickness of the common electrode 128 is greater than or equal to 10 nm and less than or equal to 30 nm, transparency to light can be provided.

The pixel electrode 122, the organic EL layer 126, and the common electrode 128 constitute the organic EL device 60.

A sealing film 130 is provided on the common electrode 128, that is, on the organic EL device 60. The sealing film 130 of the present embodiment is composed of three layers of a first sealing film 130a composed of an inorganic material, a second sealing film 130b composed of an organic material, and a third sealing film 130c composed of an inorganic material, in this order from the bottom. These sealing films serve to prevent entry of water or the like from the outside and to prevent degradation of the organic EL layer 126 and the common electrode 128.

In the present embodiment, a silicon nitride film is used as the first sealing film 130a and the third sealing film 130c. However, the present invention is not limited thereto, and a silicon oxide film may be used instead of the silicon nitride film. That is, an inorganic insulating film can be used as the first sealing film 130a and the third sealing film 130c. As the inorganic insulating film, it is particularly preferable to use an insulating film containing silicon nitride.

As the second sealing film 130b, an organic insulating film made of a resin material is used. In the present embodiment, by using an organic insulating film made of a resin material as the second sealing film 130b, it is possible to flatten the undulations formed by the bank 124. Since the first sealing film 130a has a film thickness of about 1 μm, it is formed along the inclined surfaces of the bank 124. On the other hand, since the second sealing film 130b is formed to a thickness of about 10 μm, the undulations formed by the bank 124 can be sufficiently filled. Therefore, by using the organic insulating film as the second sealing film 130b, it is possible to make the unevenness generated on the upper surface of the second sealing film 130b smaller than the unevenness generated on the upper surface of the first sealing film 130a.

As described above, in the organic EL display device 100 of the present embodiment, a plurality of the pixel 20a having the structures shown in FIG. 5 is disposed on the first surface of the support substrate 101. As shown in FIGS. 1 and 5, the plurality of alignment marks 12 and 14 formed in the process of forming the pixel 20a are disposed on the first surface of the support substrate 101.

The plurality of alignment marks 12 and the plurality of alignment marks 14 function as landmarks for determining the folding position 110 when folding the organic EL display device 100. For example, the folding position 110 can be accurately adjusted by selecting a pair of alignment marks (e.g., the alignment mark 12a and 12d in FIG. 3) in desired combinations from the plurality of alignment marks 12. As a result, the folding accuracy of the display device using the flexible substrate can be improved.

In the present embodiment, the individual alignment marks constituting the plurality of alignment marks 12 and the plurality of alignment marks 14 are arranged at equal intervals (P). However, for example, in a predetermined region, the arrangement density of the plurality of alignment marks 12 and the plurality of alignment marks 14 can be made higher than that in other regions. Specifically, in a region in which it is desired to finely adjust the folding position, the folding position can be finely adjusted by increasing the arrangement density compared to other regions.

Second Embodiment

In the present embodiment, an example in which the configuration of the alignment mark is different from that of the first embodiment will be described. In the present embodiment, elements same as those of the organic EL display device 100 of the first embodiment is denoted by the same reference numerals, and descriptions thereof may be omitted.

Figure 6:
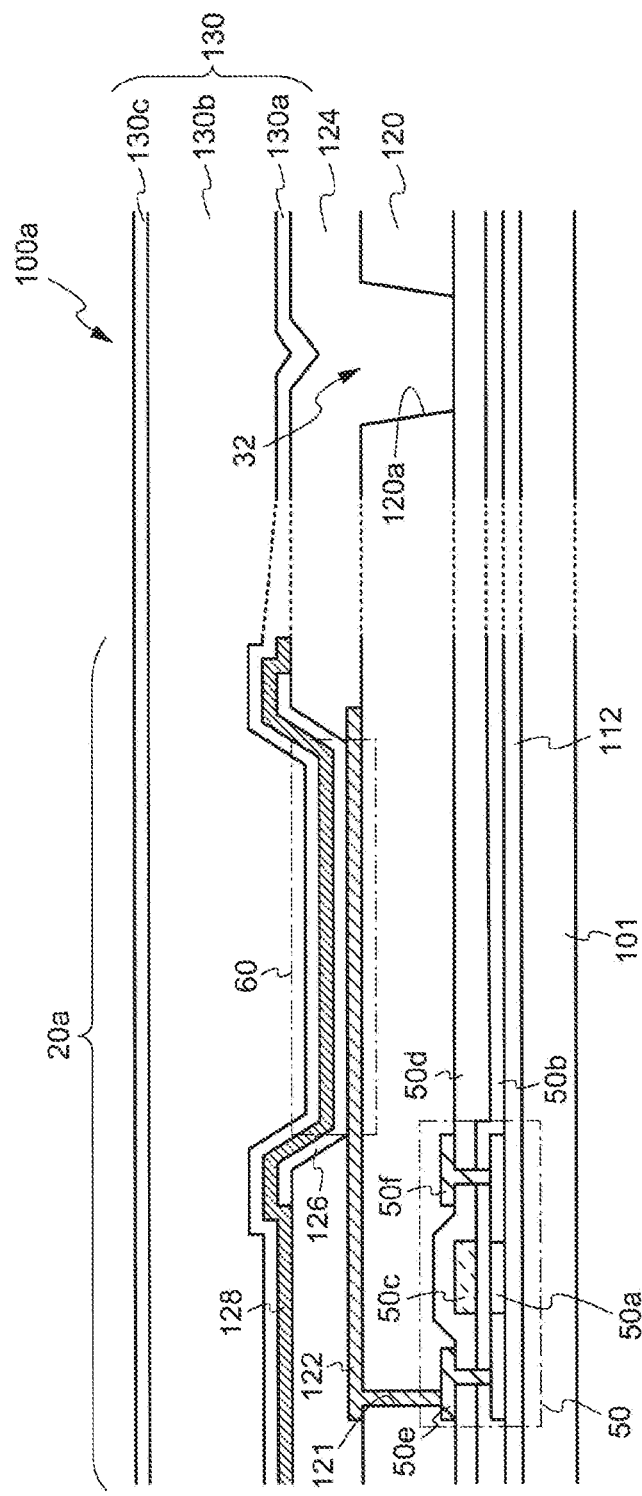
FIG. 6 is a cross-sectional diagram showing a structure of an organic EL display device according to second embodiment.

FIG. 6 is a cross-sectional view showing a configuration of the organic EL display device 100a according to the second embodiment. Difference from the organic EL display device 100 shown in FIG. 5 is that the plurality of alignment marks 32 is constituted by an opening part 120a provided in the organic insulating film 120. That is, in the first embodiment, the plurality of alignment marks 12 is formed by patterning the metallic layers into a desired shape, whereas in the present embodiment, the plurality of alignment marks 32 is formed by patterning the organic insulating film 120 to form the opening part 120a in a desired shape. Although only one alignment mark 32 is illustrated in FIG. 6 for convenience of description, the plurality of alignment marks 32 is actually formed.

In the present embodiment, although the plurality of alignment marks 32 is formed using the opening part 120a provided in the organic insulating film 120 functioning as a planarizing film, the plurality of alignment marks 32 may be formed using an opening part provided in the support substrate 101 made of a resin material such as polyimide. The opening part 120a can be formed at the same time as the opening part 121 is formed with respect to the organic insulating film 120.

Third Embodiment

In the present embodiment, an example in which the configuration of the alignment mark is different from that of the first embodiment will be described. In the present embodiment, elements same as those of the organic EL display device 100 of the first embodiment is denoted by the same reference numerals, and descriptions thereof may be omitted.

Figure 7:
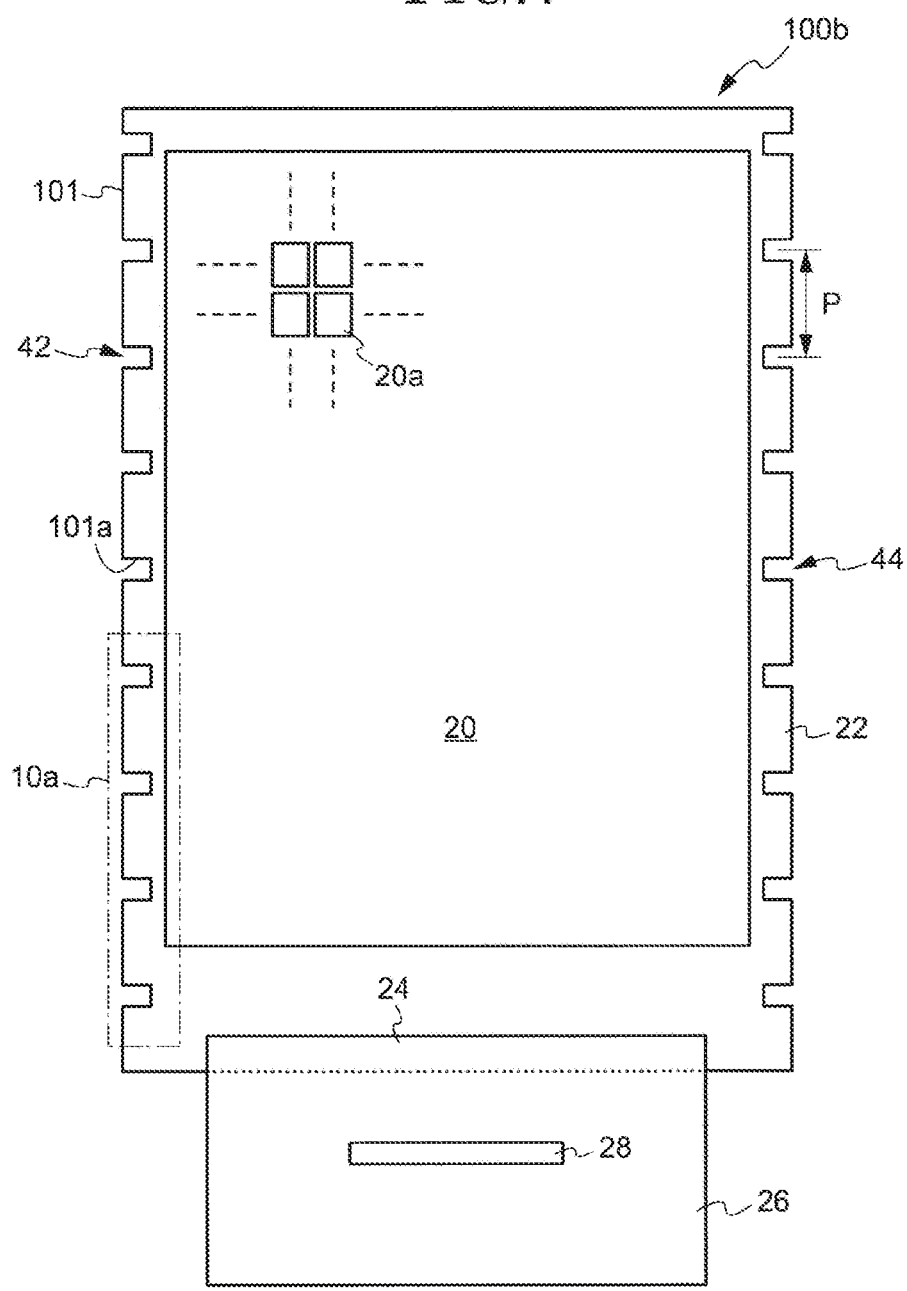
FIG. 7 is a cross-sectional diagram showing a structure of an organic EL display device according to third embodiment.
Figure 8:
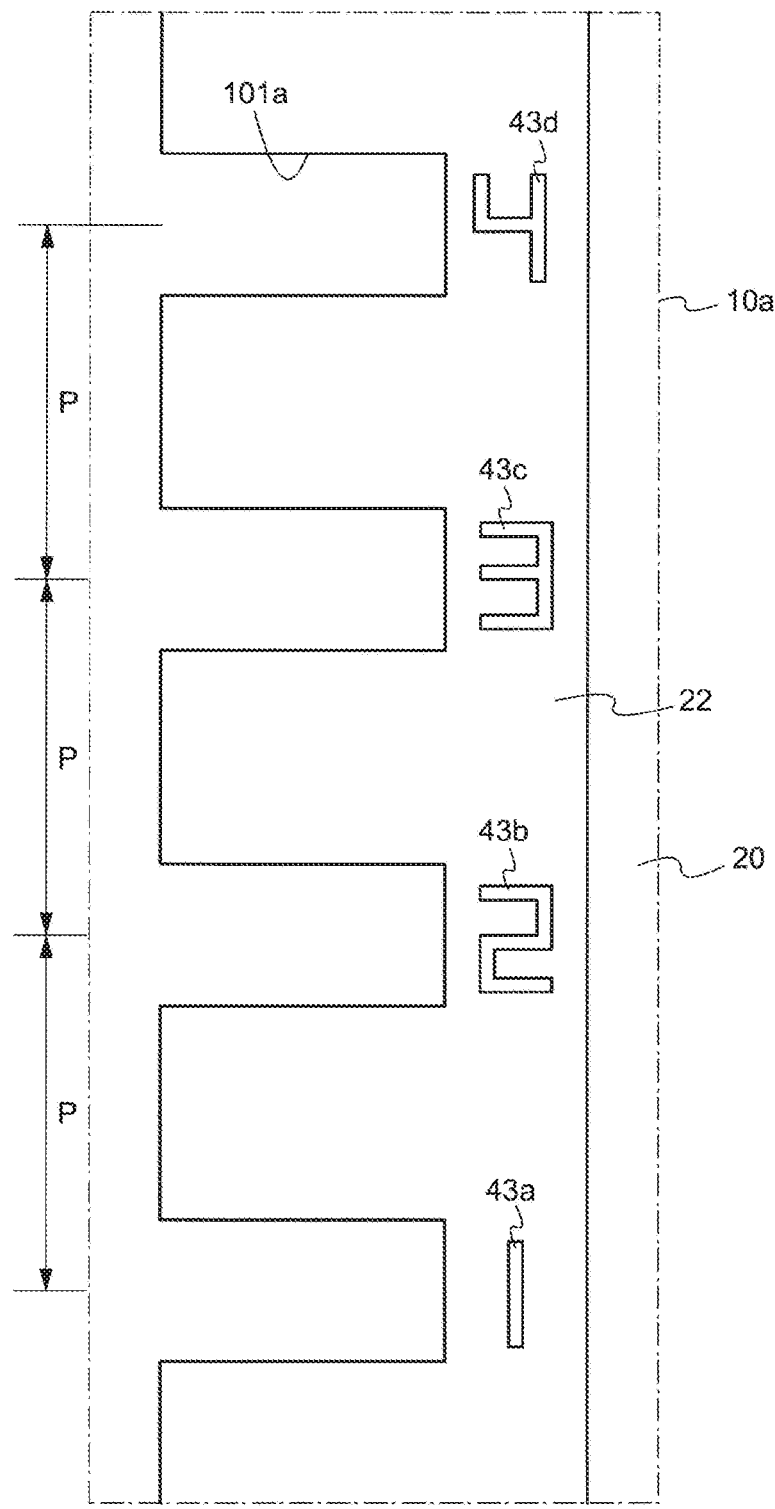
FIG. 8 is an enlarged planar view showing a structure of an alignment mark of the organic EL display device according to the third embodiment.

FIG. 7 is a planar view showing the configuration of the organic EL display device 100b according to the third embodiment. Difference from the organic EL display device 100 shown in FIG. 5 is that a plurality of alignment marks 42 and a plurality of alignment marks 44 are constituted by a concave part 101a provided on the end face of the support substrate 101. FIG. 8 is an enlarged planar view showing the configuration of the alignment mark 42 in the organic EL display device 100b of the third embodiment. Specifically, FIG. 8 corresponds to an enlarged planar view of the region surrounded by a frame line 10a in FIG. 7.

The concave part 101a shown in FIG. 7 may be formed by, for example, irradiating the support substrate 101 with UV light or laser light, or may be formed by patterning. Further, the support substrate 101 can be formed by physically cutting using cutters or the like.

Here, focusing on the plurality of alignment marks 42 in the frame line 10a, as shown in FIG. 8, indicators 43a to 43d which differ individually are arranged in the vicinity of the respective concave part 101a in the frame line 10a. In other words, in the present embodiment, by providing the indicators 43a to 43d, the concave part 101a having the same shapes can be mutually identified and used as the alignment mark. In the present embodiment, although the numerals are used as the indicators 43a to 43d, the present invention is not limited to this, numerals, letters, symbols, or combinations thereof can be used to identify the alignment mark 42.

At this time, the indicator 43a to 43d can be formed using the same metallic layer, for example, as the gate electrode 50c or the source electrode 50e (or the drain electrode 50f) in the process of forming the thin film transistor 50 as described in the first embodiment. In addition, similarly to the second embodiment, the opening part 120a provided in the organic insulating film 120 may be used.

According to the present embodiment, since the plurality of alignment marks 42 and the plurality of alignment marks 44 respectively have different indicator, the plurality of alignment marks 42 and the plurality of alignment marks 44 can be mutually identified even if the shapes of the concave part 101a are the same.

Fourth Embodiment

In the present embodiment, examples will be described in which the front (first surface) side and the rear (second surface) side of display device are distinguished from each other by using different types of the alignment mark. In the present embodiment, elements same as those of the organic EL display device 100 of the first embodiment is denoted by the same reference numerals, and descriptions thereof may be omitted.

Figure 9:
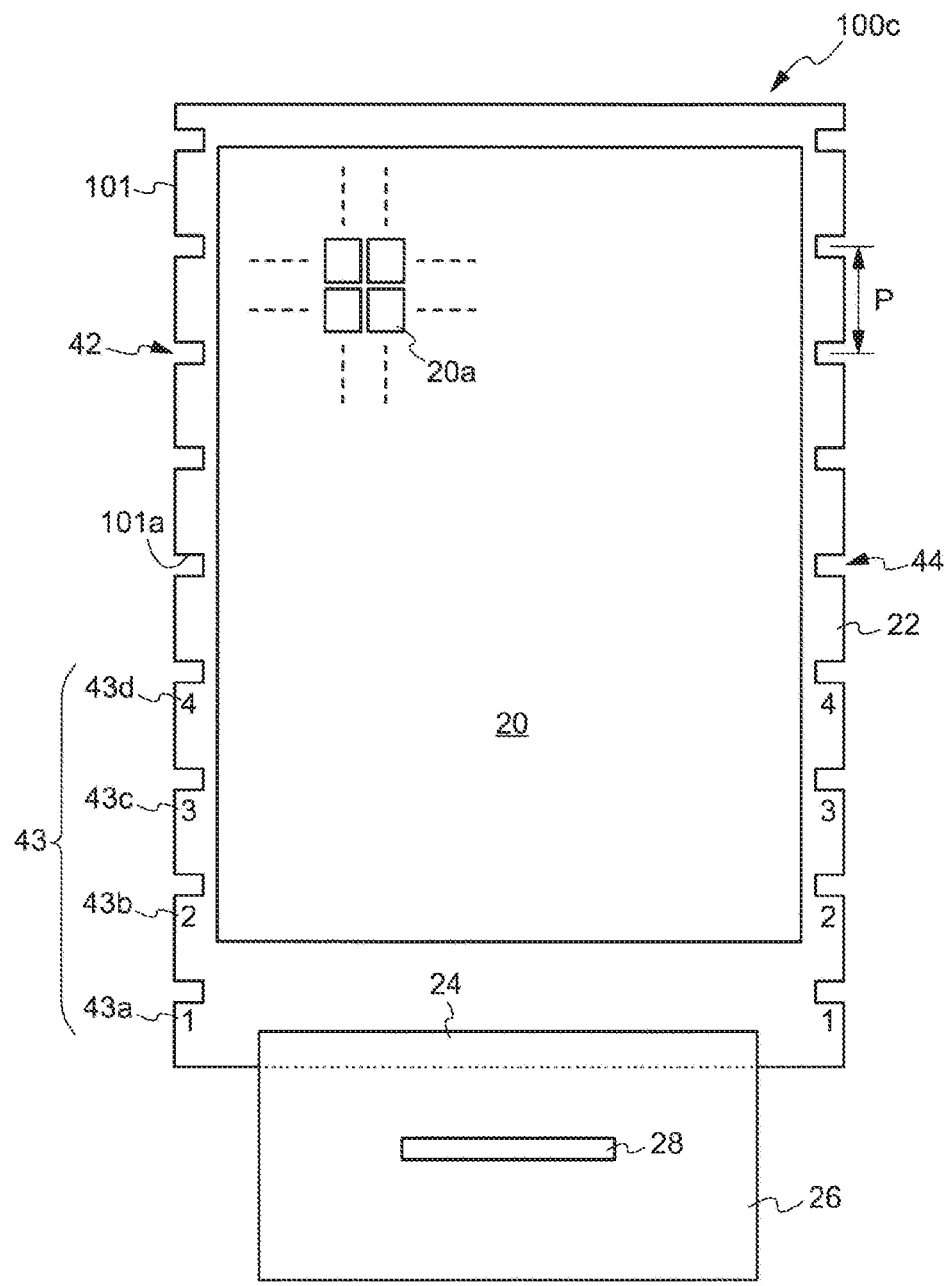
FIG. 9 is a cross-sectional diagram showing a structure of an organic EL display device according to fourth embodiment.
Figure 10:
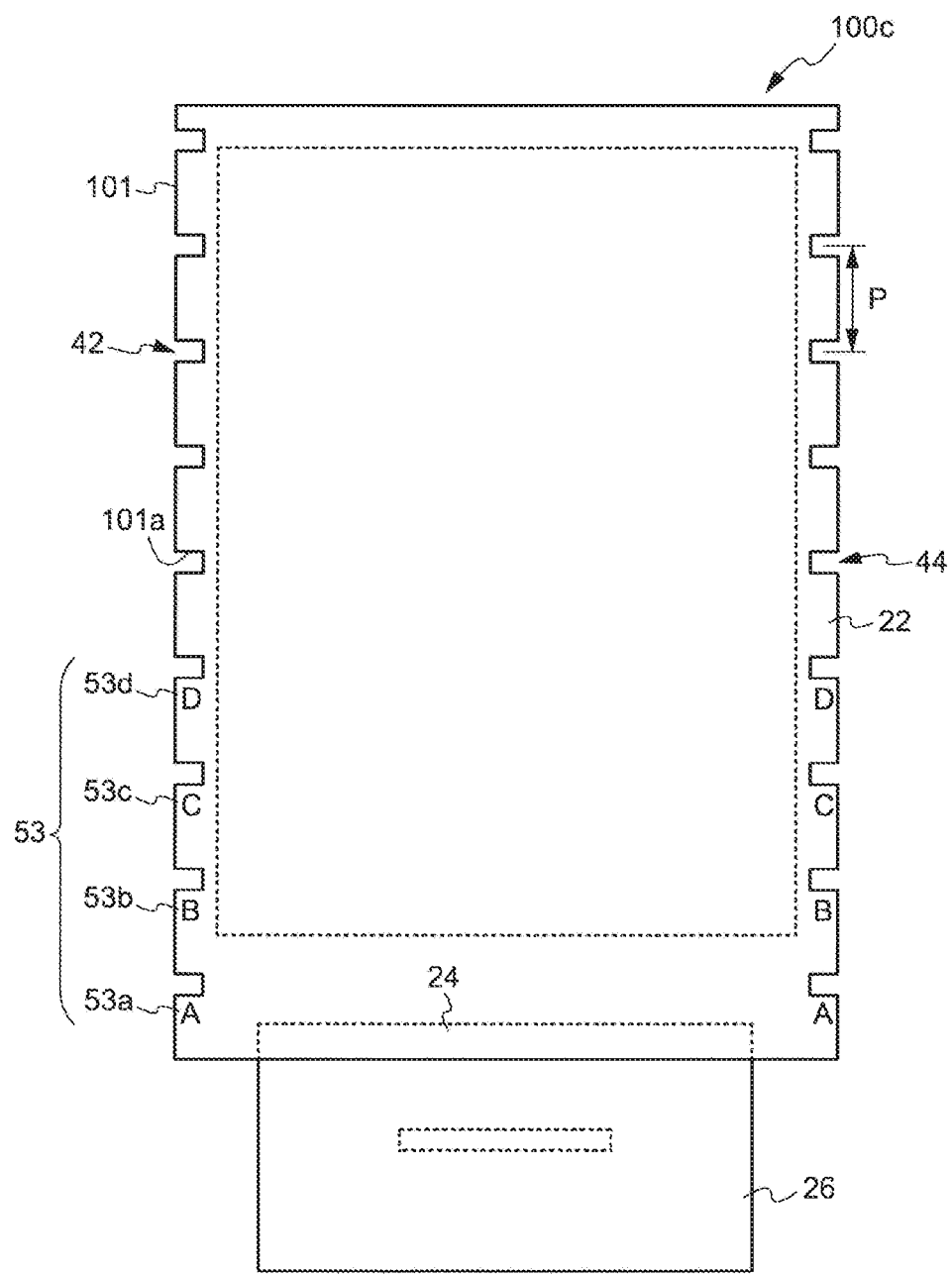
FIG. 10 is a rear diagram showing a structure of an organic EL display device according to fourth embodiment.

FIG. 9 is a planar view showing a configuration of an organic EL display device 100c according to the fourth embodiment. Specifically, FIG. 9 shows the organic EL display device 100c as viewed from the front side (first surface). FIG. 10 is a rear view showing the configuration of the organic EL display device 100c according to the fourth embodiment. Specifically, FIG. 10 shows a view of the organic EL display device 100c as viewed from the rear side (second surface).

As shown in FIG. 9, in the present embodiment, a plurality of concave parts 101a is provided on the end surface of the support substrate 101, and a plurality of indicators 43a to 43d (hereinafter, referred to as a plurality of indicators 43 when they do not need to be individually distinguished) is arranged in the vicinity of the respective concave part 101a on the first surface of the support substrate 101. FIG. 9 shows an example in which the concave part 101a is provided on the end surfaces of the left and right ends. In FIG. 9, the plurality of indicators 43a to 43d is shown by exemplifying numbers 1 to 4, but the plurality of indicators 43 may be provided as many as the number of concave parts 101a. For example, in FIG. 9, since nine concave parts 101a are formed along one side of the support substrate 101, a number of 1 to 9 may be assigned as the plurality of indicators 43.

On the other hand, as shown in FIG. 10, on the second surface of the support substrate 101, a plurality of indicators 53a to 53d (hereinafter, referred to as a plurality of indicators 53 when they do not need to be individually distinguished) is arranged in the vicinity of the respective concave part 101a. At this time, in the present embodiment, characters (specifically, alphabets) are used as the plurality of indicators 53a to 53d. That is, in the organic EL display device 100c of the present embodiment, the plurality of indicators 43 composed of numerals is provided on the first surface (front surface) side of the support substrate 101, and the plurality of indicators 53 composed of characters is provided on the second surface (rear surface) side.

Since the plurality of indicators 43 and the plurality of indicators 53 can identify each other, the front surface side and the rear surface side of the organic EL display device 100c can be easily identified. Therefore, for example, when the organic EL display device 100c is folded with the front side (the side on which the display region 20 is disposed) facing outward, alignment may be performed using the plurality of indicators 43. Conversely, when the organic EL display device 100c is folded with the front side facing inward, alignment may be performed using the plurality of indicators 53.

In the present embodiment, the concave part 101a provided on the end surface of the support substrate 101 is used as the plurality of alignment marks 42 and the plurality of alignment marks 44, but the present invention is not limited thereto. For example, it may be formed using a metallic layer as in the first embodiment, or an organic insulating film as in the second embodiment. Further, in the present embodiment, although identifying between the front surface side and the rear surface side of the display device 100c is exemplified by using the plurality of indicators 43 and 53 which can identify each other, identifying can be performed in the form of the concave part 101a. When a metallic layer is used as in the first embodiment, or when an organic insulating film is used as in the second embodiment, identifying between the front surface side and the rear surface side of the display device 100c can be performed in the form of patterns of the alignment mark.

Fifth Embodiment

In the present embodiment, an exemplary configuration in which the end part of the organic EL display device (specifically, the part where the flexible printed circuit substrate is mounted) is folded will be described. In the present embodiment, elements same as those of the organic EL display device 100 of the first embodiment is denoted by the same reference numerals, and the descriptions thereof may be omitted.

Figure 11:
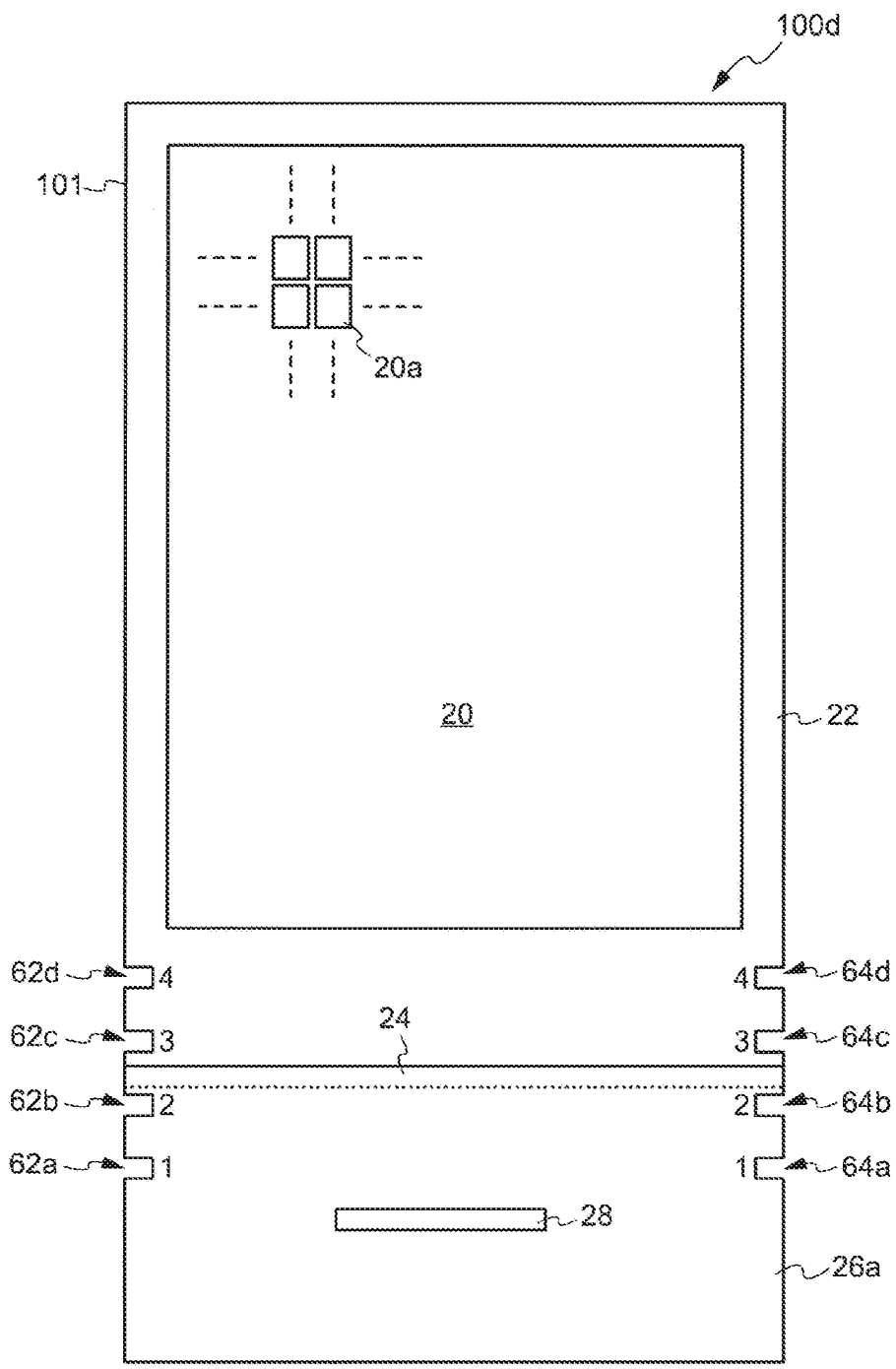
FIG. 11 is a planar diagram showing a structure of an organic EL display device according to fifth embodiment.

FIG. 11 is a planar view showing the configuration of the organic EL display device 100d according to the fifth embodiment. In FIG. 11, alignment marks 62a and 62b are arranged along one side on the left side toward the flexible printed circuit substrate 26a, and alignment marks 64a and 64b are arranged along one side on the right side. Alignment marks 62c and 62d are arranged along one side on the left side toward the support substrate 101, and alignment marks 64c and 64d are arranged along one side on the right side.

At this time, the alignment marks 62a and 62b of the flexible printed circuit substrate 26a and the alignment marks 62c and 62d of the support substrate 101 are aligned on the same straight line. This makes it possible to perform alignment processing using the alignment marks 62a to 62d. This configuration is the same for the alignment marks 64a to 64d.

In this case, for example, the folding position (not shown) can be set in the support substrate 101 by aligning the alignment mark 62b and the alignment mark 62d, or the folding position (not shown) can be set in the flexible printed circuit substrate 26a by aligning the alignment mark 62a and the alignment mark 62c.

As described above, in the present embodiment, the alignment mark 62a to 62d and the alignment mark 64a to 64d are provided across the support substrate 101 and the flexible printed circuit substrate 26a. As a result, in the organic EL display device 100d, the folding accuracy of the part on which the flexible printed circuit substrate 26a is mounted can be improved.

In the present embodiment, the alignment mark described in the third embodiment is arranged as the alignment mark 62a, 62b, 64a, and 64b arranged on the flexible printed circuit substrate 26a. However, the present invention is not limited thereto, and the alignment mark 62a, 62b, 64a, and 64b disposed on the flexible printed circuit substrate 26a may be formed by, for example, screen printing, silk printing, or the like. As the alignment mark 62c, 62d, 64c, and 64d disposed on the support substrate 101, the alignment mark described in the first embodiment or the second embodiment may be disposed.

Sixth Embodiment

In the present embodiment, an exemplary configuration in which the end part of the organic EL display device (specifically, the part where the flexible printed circuit substrate is mounted) is folded will be described. In the present embodiment, elements same as those of the organic EL display device 100 of the first embodiment are denoted by the same reference numerals, and the descriptions thereof may be omitted.

Figure 12:
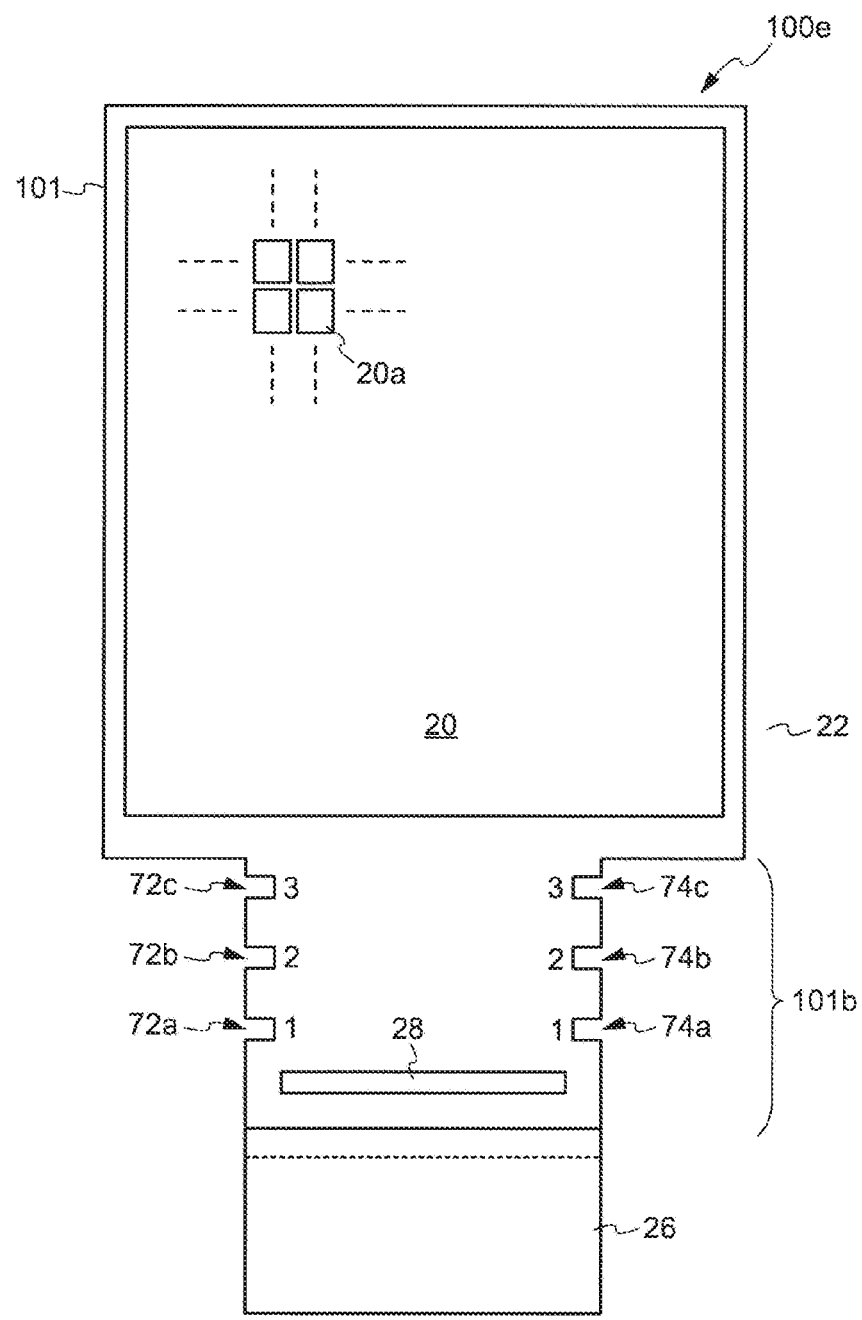
FIG. 12 is a planar diagram showing a structure of an organic EL display device according to sixth embodiment.

FIG. 12 is a planar view showing a configuration of an organic EL display device 100e according to the sixth embodiment. In FIG. 12, a part of the support substrate 101 other than the part where the display region 20 is provided functions as a folding region 101b. In the present embodiment, the alignment marks 72a to 72c are arranged along one side on the left side toward the folding region 101b, and the alignment marks 74a to 74c are arranged along one side on the right side.

In this case, a part of the support substrate 101 other than the folding region 101b can be utilized as the display region 20 to the maximum extent. In addition, by using the alignment mark 72a to 72c and the alignment mark 74a to 74c arranged in the folding region 101b, the folding accuracy of the part where the flexible printed circuit substrate 26 is mounted can be improved. Therefore, it is possible to realize the organic EL display device 100e in which the bezel part is made as narrow as possible.

Seventh Embodiment

In the present embodiment, an exemplary configuration will be described in which the alignment mark is arranged on the spacer when the end part of the organic EL display device (specifically, a part where the flexible printed circuit substrate is mounted) is folded. In the present embodiment, elements same as those of the organic EL display device 100 of the first embodiment is denoted by the same reference numerals, and the descriptions thereof may be omitted.

Figure 13:
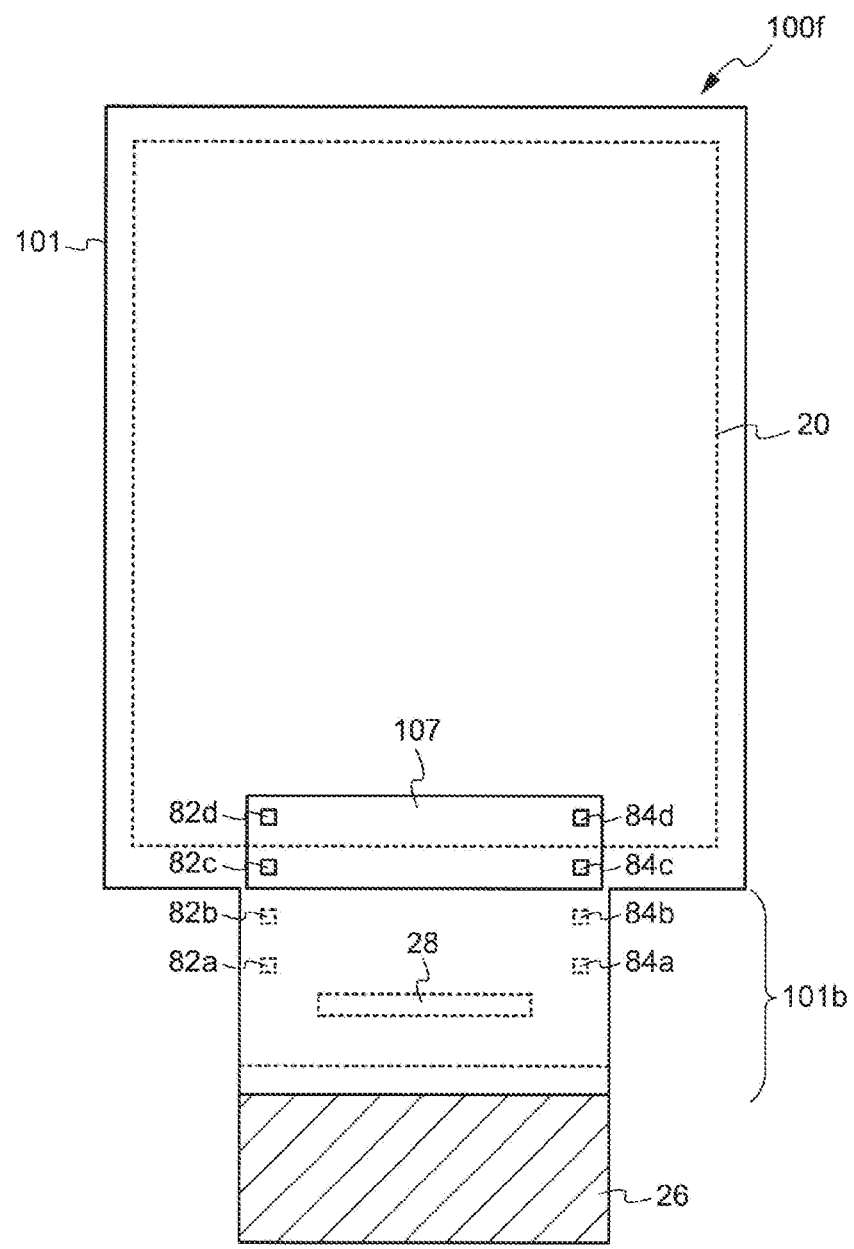
FIG. 13 is a planar diagram showing a structure of an organic EL display device according to seventh embodiment.
Figure 14:
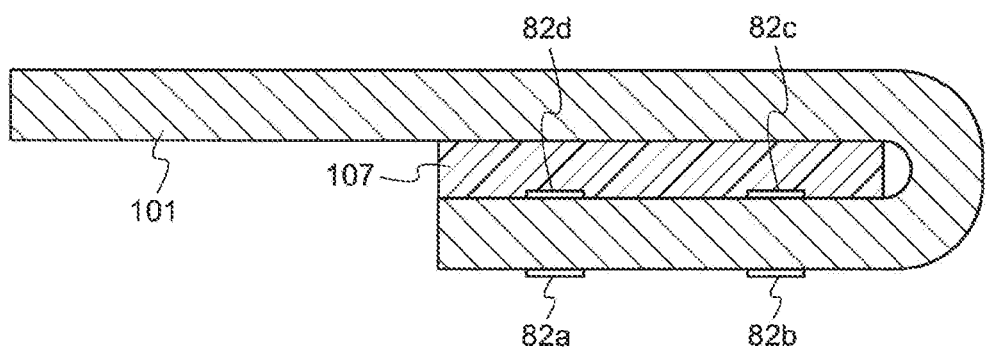
FIG. 14 is a diagram for explaining the adjustment method of the bending position using an alignment mark according to seventh embodiment.

FIG. 13 is a planar view showing a configuration of an organic EL display device 100f of the seventh embodiment. However, FIG. 13 shows the organic EL display device 100f as viewed from the second surface (rear side) side. FIG. 14 is a diagram for explaining how to adjust the folding position using the alignment mark of the seventh embodiment.

In FIG. 13, a part of the support substrate 101 other than the part where the display region 20 is provided functions as the folding region 101b. In the present embodiment, alignment marks 82a and 82b are arranged along one side on the left side toward the folding region 101b, and the alignment marks 84a and 84b are arranged along one side on the right side. At this time, the alignment marks 82a, 82b, 84a, and 84b are provided on the first surface of the support substrate 101 (specifically, the folding region 101b of the support substrate 101). As the alignment mark 82a, 82b, 84a, and 84b of the present embodiment, for example, the alignment mark described in the first embodiment or the second embodiment can be used.

In the present embodiment, the spacer 107 is disposed in contact with the second surface of the support substrate 101. However, for convenience of explanation, FIG. 13 shows a state in which the folding region 101b is not folded. In practice, the support substrate 101 has a curved part (corresponding to the curved part 105 of FIG. 2) so that the second surface have a part facing each other via the spacer 107. The folding region 101b may be a region opposed to the display region 20 with respect to the curved part.

At this time, as shown in FIG. 13, the spacer 107 has alignment marks 82c and 82d along one side on the left side toward the spacer 107, and alignment marks 84c and 84d along one side on the right side. In the present embodiment, the alignment marks 82c, 82d, 84c, and 84d are formed by etching the spacer 107. However, the present invention is not limited thereto, and the alignment mark 82c, 82d, 84c, and 84d formed by patterning the metal layer may be arranged on the spacer 107.

In the present embodiment, the folding position (not shown) of the organic EL display device 100f is adjusted using the alignment mark 82a, 82b, 84a, and 84b provided on the support substrate 101 and the alignment mark 82c, 82d, 84c, and 84d provided on the spacer 107. For example, as shown in FIG. 14, the folding position of the organic EL display device 100f can be accurately adjusted by facing the alignment mark 82a and the alignment mark 82d.

In the present embodiment, an example in which the alignment mark described in the first embodiment is arranged as the alignment mark 82c, 82d, 84c, and 84d arranged in the spacer 107 has been described. However, the present invention is not limited to this, and for example, the alignment mark described in the second embodiment can be arranged. Also, as described in the first embodiment or the second embodiment, varying the shape of the alignment marks enables us to distinguish an alignment mark from another. Further, as described in the third embodiment, using an indicator enables us to distinguish an alignment mark from another.

In the present embodiment, an organic EL display device has been exemplified as a disclosure example. However, as another application example, any flat panel display device such as a self-luminous device other than the organic EL display device, a liquid crystal display device, or an electronic paper type display device having an electrophoretic element etc. can be used. In addition, the present invention can be applied from small sized display device to large sized display device, without particularly limiting the size of the display.

Each embodiment described above as embodiments of the present invention can be implemented in combination as appropriate as long as they do not contradict each other. In addition, those skilled in the art could appropriately add, delete or change the design of the constituent elements based on the display device of each embodiment, or add, omit or change conditions as long as it does not depart from the concept of the present invention and such changes are included within the scope of the present invention.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:

1. A display device comprising:
a flexible substrate;
pixels disposed on a first surface of the flexible substrate; and
alignment marks disposed along one side of the flexible substrate and being distinguishable from each other, wherein
a distance between any two neighboring alignment marks is constant.

2. The display device according to claim 1, wherein the alignment marks are arranged in a same layer.

3. The display device according to claim 2, wherein each of the pixels includes a thin film transistor, and
the alignment marks are formed from a same metal layer forming the thin film transistor.

4. The display device according to claim 1, wherein each of the alignment marks is constituted by an opening part provided in an organic insulating film on the first surface.

5. The display device according to claim 1, wherein each of the alignment marks is constituted by a concave part provided on an end surface of the flexible substrate.

6. The display device according to claim 1, wherein each of the alignment marks has a different shape.

7. The display device according to claim 1, wherein each of the alignment marks has an indicator, and each indicator is different.

8. The display device according to claim 7, wherein indicators are numerals, letters, symbols, or combinations thereof.

9. The display device according to claim 7, wherein the indicators are arranged on the first surface;
other indicators corresponding to the alignment marks are arranged on a second surface opposite to the first surface of the flexible substrate, and
the indicators on the first surface and the other indicators on the second surface are distinguishable from each other.

10. A display device comprising:

a flexible substrate;

pixels disposed on a first surface of the flexible substrate;

first alignment marks arranged along one side of the flexible substrate;

a resin film connected on the first surface, and second alignment marks arranged along one side of the resin film, wherein the first alignment marks and the second alignment marks are arranged on a same straight line and are distinguishable from each other.

11. The display device according to claim 10, wherein each of the second alignment marks has a different shape.

12. The display device according to claim 10, wherein each of the second alignment marks has an indicator, and each indicator is different.

13. The display device according to claim 12, wherein indicators are numerals, letters, symbols, or combinations thereof.

14. The display device according to claim 10, wherein each of the second alignment marks is constituted by a concave part provided on an end surface of the flexible substrate.

15. A display device comprising:

a flexible substrate;

pixels disposed on a first surface of the flexible substrate;

a first alignment mark arranged along one side of the flexible substrate;

a spacer disposed adjacent to a second surface of the flexible substrate opposite to the first surface; and second alignment marks disposed along one side of the spacer and being distinguishable from each other, wherein the flexible substrate has a curved part such that a part of the second surface faces another part of the second surface via the spacer, the first alignment mark is disposed in a region opposite to a region in which the pixels are disposed with respect to the curved part, one of the second alignment marks faces the first alignment mark in a planar view, and each of the second alignment marks has a different shape.

16. The display device according to claim 15, wherein each of the second alignment marks has an indicator, and each indicator is different.

17. The display device according to claim 16, wherein indicators are numerals, letters, symbols, or combinations thereof.

* * * * *